United States Patent [19]

Sakurai

[11] 4,407,060
[45] Oct. 4, 1983

[54] METHOD OF MANUFACTURING A SEMICONDUCTOR DEVICE

[75] Inventor: Junji Sakurai, Tokyo, Japan

[73] Assignee: Fujitsu Limited, Kawasaki, Japan

[21] Appl. No.: 263,281

[22] Filed: May 13, 1981

[30] Foreign Application Priority Data

May 14, 1980 [JP] Japan ................... 55/63571

[51] Int. Cl.³ ............ H01L 21/265; H01L 21/268
[52] U.S. Cl. .................. 29/576 E; 29/576 W; 148/1.5; 148/187; 148/188; 148/175
[58] Field of Search ............ 148/188, 187, 1.5, 186, 148/175; 29/571, 576 W, 576 E

[56] References Cited

U.S. PATENT DOCUMENTS

| | | | |
|---|---|---|---|
| 3,420,719 | 1/1969 | Potts | 148/188 |
| 4,046,607 | 9/1977 | Inoue et al. | 148/188 |
| 4,124,934 | 11/1978 | De Brebisson | 148/188 X |
| 4,182,024 | 1/1980 | Cometta | 29/571 |
| 4,210,993 | 7/1980 | Sunami | 29/571 |
| 4,267,011 | 5/1981 | Shibata et al. | 29/571 X |
| 4,268,950 | 5/1981 | Chatterjee et al. | 29/571 |

Primary Examiner—G. Ozaki
Attorney, Agent, or Firm—Staas & Halsey

[57] ABSTRACT

Shallow uniform impurity diffusion regions in a semiconductor substrate can be formed through the steps of forming an insulating film having a window on the semiconductor substrate, forming a semiconductor layer on the insulating film and semiconductor substrate exposed at the window, and diffusing a specified impurity from this semiconductor layer into the semiconductor substrate with the melt of semiconductor layer by a high energy beam such as a laser.

Simultaneously, the melted semiconductor layer is recrystallized and is used as a contact electrode having a low resistance and extending from the impurity diffusion region. Diffusion of the impurity into the semiconductor layer, which is the impurity diffusion source, can be performed at the time of forming the semiconductor layer or after the formation of the semiconductor layer.

8 Claims, 24 Drawing Figures

METHOD OF MANUFACTURING A SEMICONDUCTOR DEVICE

BACKGROUND OF THE INVENTION

1. Field of the Invention

The present invention relates to a method of diffusing an impurity during the manufacturing of a semiconductor device in particular, to a method of diffusing an impurity having a specified conductivity type, from the layer containing the impurity formed on a semiconductor substrate into the substrate.

Diffusion methods of this type, such as a method of using the insulating film containing an impurity and a method of using the semiconductor layer containing an impurity are generally known.

2. Description of the Prior Art

FIGS. 1A to 1E show the method of diffusing an impurity where phospho-silicate-glass (PSG) film is used as an insulating film containing an impurity.

In FIG. 1A, reference numeral 1 indicates a p type silicon semiconductor substrate, while reference numeral 2 is a silicon dioxide ($SiO_2$) film.

The $SiO_2$ film 2 is provided on the substrate with a window at a specified area.

In FIG. 1B, reference numeral 3 indicates a PSG film. This PSG film 3 contains about 20% phosphorus and has a thickness of about 1 $\mu$m.

FIG. 1C illustrates a semiconductor substrate 1 after being annealed for about 20 minutes at a temperature of about 1050° C. in the nitrogen ($N_2$) atmosphere. Thereby, the n type impurity diffused portion shown, reference numeral 5 is formed. The depth of the portion 5 is about 0.4 $\mu$m and its sheet resistance $\rho_s$ is about 20 $\Omega$/square.

To make electrical connection with this impurity diffused portion 5, a window 6 is formed as shown in FIG. 1D.

As shown in FIG. 1E, an aluminum layer (Al) 7 is ordinarily used as the contact electrode. On the occasion of obtaining an ohmic-contact between the impurity diffused portion 5 and the Al layer 7 provided on the semiconductor substrate, the formation of an alloy of the Al and Si sometimes proceeds abnormally, thus destroying the shallow pn junction formed in the semiconductor substrate 1. Therefore, a thin polycrystalline silicon is formed on the silicon substrate surface, and then after forming the Al layer 7 thereon, the Al and Si are alloyed. Usually, the thermal process for rounding the edges of the window of the PSG layer 3 is carried out before depositing the Al, in order to prevent breaks in the Al layer 7.

As explained above, the impurity diffusion method utilizing the insulation film containing an impurity requires various processes, and also requires a variety of steps for forming a low resistance electrode contacting the impurity diffused area formed in the semiconductor substrate.

FIGS. 2A through 2C show an impurity diffusion method where polycrystalline silicon is used as the semiconductor layer containing an impurity.

In FIG. 2A, reference numeral 11 indicates a p type silicon semiconductor substrate, reference numeral 12 designates a silicon dioxide film and reference numeral 17 designates a polycrystalline silicon layer.

The thickness of polycrystalline silicon (poly-Si) layer 17 is about 0.4 $\mu$m. The poly-Si layer may contain an impurity when formed or be doped with an impurity after a non-doped poly-Si is formed.

Thereafter, the annealing is carried out for about 20 minutes at a temperature of about 1050° C. in a $N_2$ atmosphere. Thereby, the n type impurity diffused portion indicated by the reference numeral 15 in FIG. 2B is formed. The depth of the impurity diffused portion 15 at the center is about 0.4 $\mu$m, but the depth at the portion around the end of $SiO_2$ window is about 0.7 to 0.8 $\mu$m as indicated by the reference numeral 18 in FIG. 2B.

This deep impurity diffused portion 18 is usually called the "Dragon teeth" and is considered to be generated by causes explained hereunder.

(i) A stress concentration occurs inside the silicon substrate 1 due to the difference of expansion coefficients of the $SiO_2$ film 12 and poly-Si layer 17. This stress concentration allows an impurity to abnormally diffuse into the lattice defect generated by the stress.

(ii) The phosphorus contained in the poly-Si layer 17 extending over the $SiO_2$ film 12 is concentrated in the portion around the end of window and then diffused thereto.

However, such deep diffused portion is not formed by the impurity diffusion process utilizing the PSG film indicated in FIG. 1. For this reason, the inventor of the present invention believes that the first reason (i) above is the major mechanism influencing the formation of "Dragon teeth."

In the impurity diffusion method utilizing poly-Si, it is possible to execute the diffusion process, thereafter pattern the remaining poly-Si layer and use the poly-Si layer directly as the wirings. However, in the case of the ordinary poly-Si containing an impurity, the sheet resistance is as large as 50 to 70 $\Omega$/square.

When the poly-Si layer is used as the impurity diffusion source, the contact electrode can be formed rather easily from the impurity diffused portion and the process is also simplified.

In FIG. 2C, reference numeral 19 indicates the Al electrode. To obtain an ohmic-contact between the electrode 19 and the n type impurity diffused portion 15 the poly-Si layer 17 used for the impurity diffusion and the Al layer 19 must be alloyed.

As explained previously, it is possible in the process for diffusing impurity from the layer containing impurities, to form the shallow diffusion portion in a small area. However, it is difficult to form a contact electrode without deteriorating the element characteristics by abnormal diffusion in a part of the small diffusion area.

For this reason, a novel impurity diffusion method is required which solves problems of the abovementioned conventional technique.

SUMMARY OF THE INVENTION

It is an object of the present invention to realize improved semiconductor characteristics through diffusion of an impurity diffusion to an uniform depth, diffused from the semiconductor layer containing an impurity into a semiconductor substrate.

It is another object of the present invention to make it possible to extend the contact electrode having a low resistance to contact the impurity diffused portion formed in the semiconductor substrate.

It is an additional object of the present invention to lower the resistance value of the contact electrode extended to contacting the impurity diffused portion formed in the semiconductor substrate and to improve the semiconductor device characteristics.

The abovementioned objects of the present invention are attained via the impurity diffusion method comprising the following steps. First forming selectively an insulating layer, having a window, on the semiconductor substrate. Then forming a semiconductor layer containing an impurity on an insulating layer and in the window. Then, melting a part of the semiconductor layer and substrate by irradiating them with a high energy beam and diffusing an impurity, contained in the semiconductor layer, into the substrate.

The semiconductor layer containing the impurity may contain the impurity when the layer is formed or receive the impurity after the layer is formed. In addition, a semiconductor layer may be a polycrystalline semiconductor layer or an amorphous semiconductor layer.

In the present invention, a high energy beam irradiates to the semiconductor layer containing an impurity, the single-crystalline semiconductor layer remains on the substrate and is used as the contact electrode extended from the diffusion region.

Therefore, a portion of the semiconductor layer and substrate is melted when irradiated by a high energy beam, and the diffusion region having uniform depth, is instantaneously formed through the impurity diffusion. Simultaneously, the low resistance ohmic contact is formed between the semiconductor layer and the diffusion region. Additionally, the semiconductor layer has a single-crystaline structure and is used as the low resistance contact electrode.

DESCRIPTION OF THE PREFERRED EMBODIMENTS

FIGS. 3A through 3I respectively show an embodiment of the present invention at various stages during the production of a walled emitter type bipolar transistor.

Figure 1A:
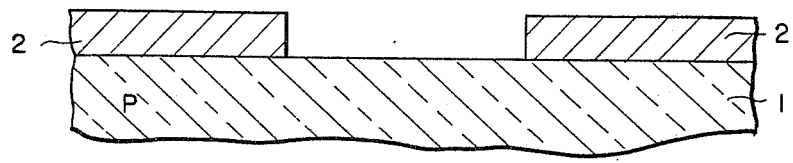
FIGS. 1A through 1E and FIGS. 2A through 2C are cross sectional views of a portion of a semiconductor device in various stages of the production process in accordance with the prior art.
Figure 1B:
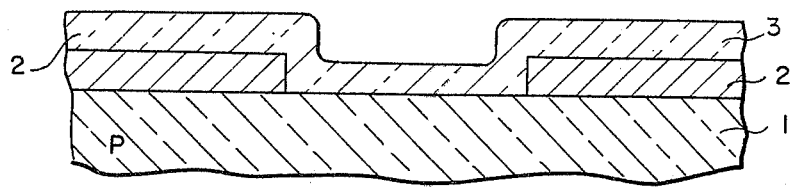
Figure 1C:
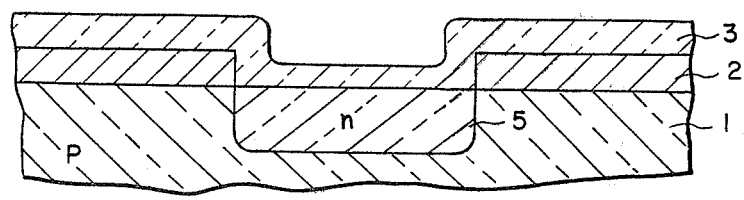
Figure 1D:
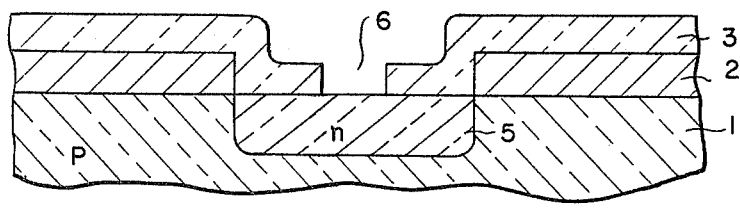
Figure 1E:
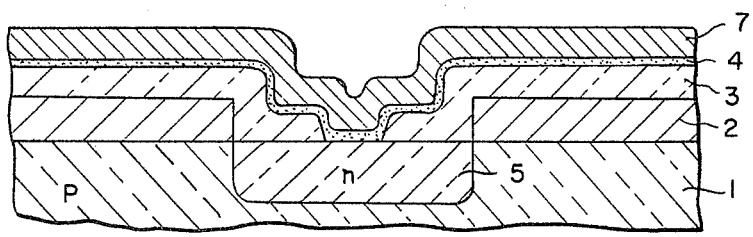
Figure 2A:
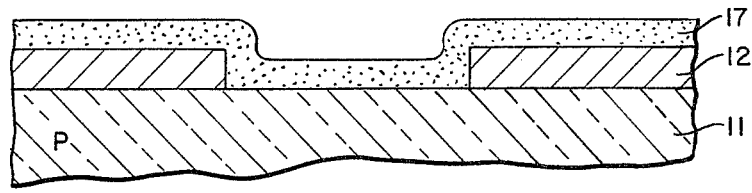
Figure 2B:
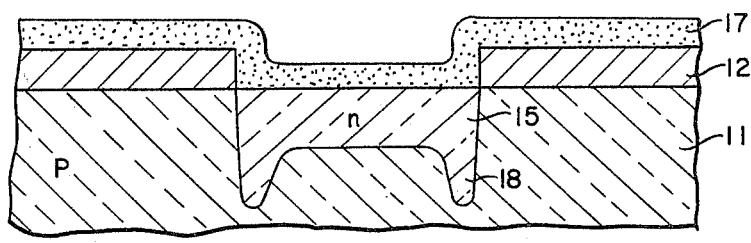
Figure 2C:
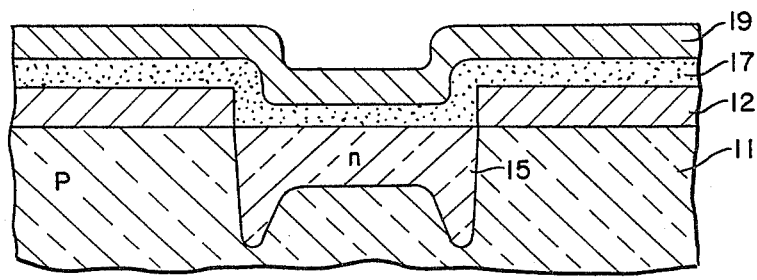
Figure 3A:
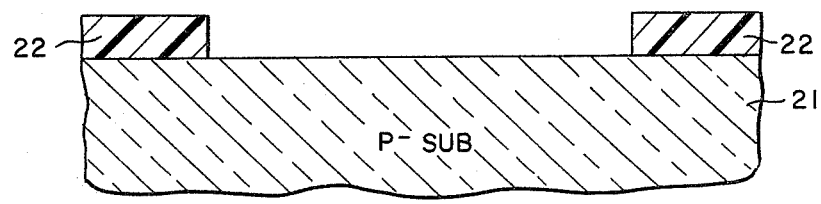
FIGS. 3A through 3I and FIGS. 4A through 4G are cross sectional views of a portion of a semiconductor device in various stages of the production process in accordance with the present invention.

In FIG. 3A, reference numeral 21 indicates the p type silicon substrate where the surface (100) is the main surface, and reference numeral 22 indicates the resist film used as a mask.

Antimony (Sb) ions are implanted into the substrate surface using an energy of 100 KeV and a dose of $1 \times 10^{15}$ cm$^{-2}$. Then, after removing the resist film 22, a silicon dioxide film is formed on the substrate surface. (Not illustrated) Thereafter, the annealing is carried out for about 70 minutes at a temperature of 1200° C. in a dry N$_2$ ambient, to form an n+ diffusion layer.

After removing the silicon oxide film, the n type epitaxial silicon layer is formed on the substrate to a thickness of about 1.5 μm.

Figure 3B:
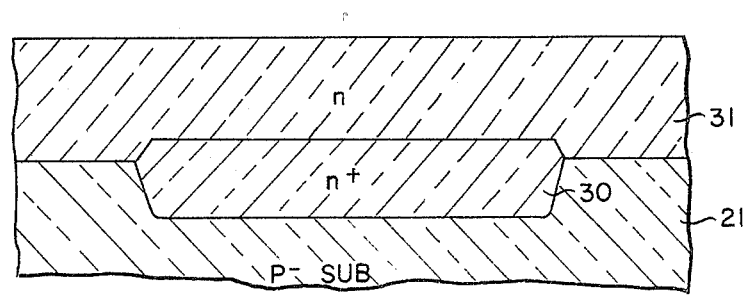

In FIG. 3B, reference numeral 30 is the n+ type buried portion, having the n+ conductivity type due to the activated Sb ions, while reference numeral 31 is the n type epitaxial silicon layer formed through thermal decomposition of monosilane (SiH$_4$). At the time of forming the epitaxial layer 31, P$_2$O$_5$ is mixed into the reaction gas to yield the n type conductivity.

Next, a silicon dioxide film is formed on the epitaxial layer 31 to a thickness of about 500 Å, by a thermal oxidation process. Then a silicon nitride (Si$_3$N$_4$) film is formed to a thickness of about 1000 Å by the ordinary CVD (Chemical Vapor Deposition) method, (not illustrated).

After selectively etching the silicon nitride film and silicon dioxide film via an ordinary photo etching method, the etching is carried out for the exposed silicon surface, etching it to a thickness of about 0.8 μm, with potassium hydroxide (KOH) used as the etching solution. The silicon epitaxial layer 31 employs the surface (100) as the main surface and the tapered groove is formed by anisotropic etching, using KOH.

Figure 3C:
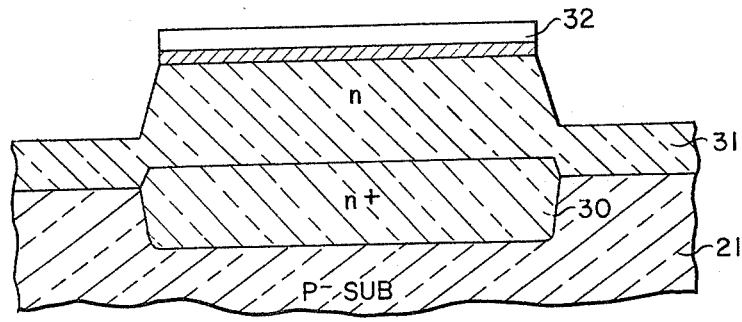

In FIG. 3C, reference numeral 32 is the silicon nitride film. Boron ions are selectively implanted into the surface using the silicon nitride film 32 and silicon oxide film as a mask. Here, the dose is $1 \times 10^{13}$ cm$^{-2}$ and energy is 50 KeV.

Then, the implanted ions are diffused employing a thermal process in a wet O$_2$ atomosphere and the silicon dioxide layer is grown in the groove to such a thickness that the surface becomes flat.

Figure 3D:
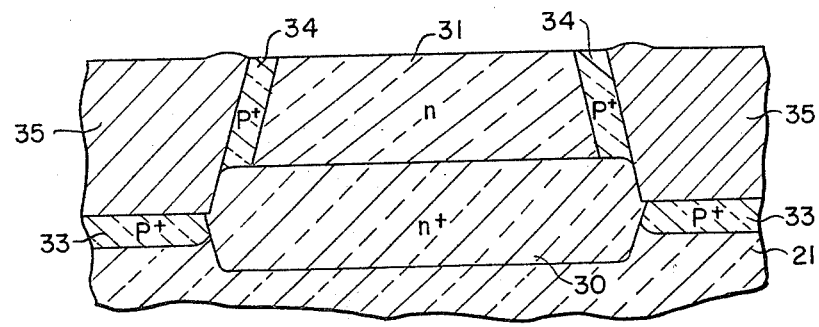

In FIG. 3D, reference numeral 33 and 34 are p+ type regions with the p+ conductivity type due to the activated boron ions, and 35 is a thick silicon dioxide film. Thereafter, a resist film is selectively formed on the surface (not illustrated), and boron ions are implanted using the resist film as a mask, with the dose of $1 \times 10^{14}$ cm$^{-2}$ and energy of 100 KeV. Next, the device is thermally processed in a N$_2$ atmosphere in order to activate the implanted ions and form the p type base region.

Figure 3E:
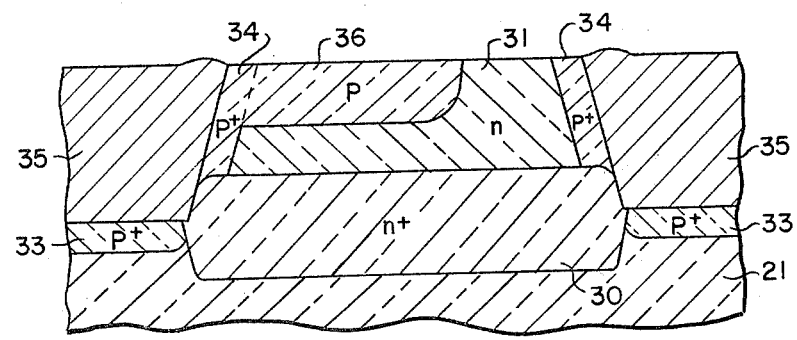
Figure 3F:
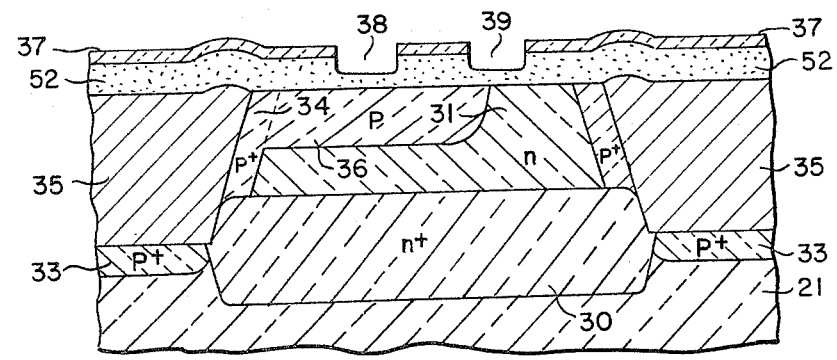

In FIG. 3E, reference numeral 36 indicates the p type base region. After forming the base region, the poly-Si layer is formed to a thickness of about 0.4 μm over the entire surface of the device, and then a Si$_3$N$_4$ film is formed to a thickness of about 500 Å. In FIG. 3F, reference numeral 52 is the poly-Si layer while reference numeral 37 is the Si$_3$N$_4$ film.

After selectively removing the Si$_3$N$_4$ film 37, the surface of the device is etched selectively, and the poly-Si layer 36 is etched to a thickness of about 0.2 μm using the remaining Si$_3$N$_4$ film 37 as a mask. The groove 38 formed by this etching is formed over the base region 36, while the other groove 39 spans the base region 36 and the collector region 31.

Figure 3G:
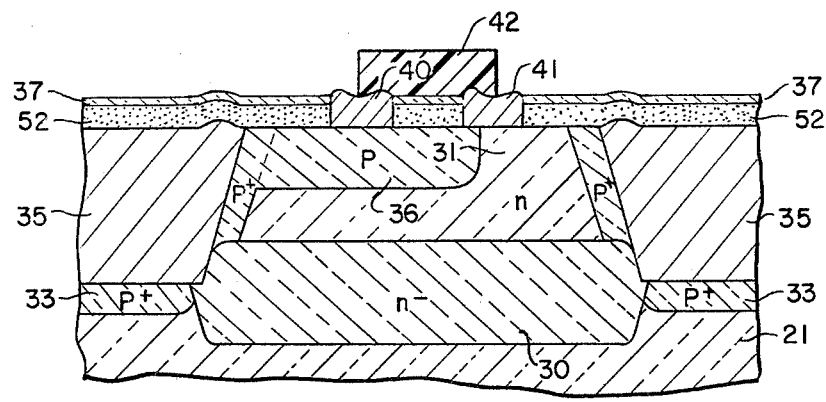

Thereafter, the poly-Si layer 52 is selectively oxidized with the Si$_3$N$_4$ film 37 used as a mask. In FIG. 3G, reference numeral 40 and 41 are silicon dioxide layers and 42 is the resist film formed as a mask.

Then phosphorus ions are implanted with the resist 42 bridging over the silicon oxide films 40 and 41 used as a mask. Then ion implantation is carried out with a dose of about $5 \times 10^{16}$ cm$^{-2}$ and an energy of about 150 KeV. Therefore, all ions implanted remain in the poly-Si layer 36.

Next, a mask (not illustrated) comprising the inversion of the resist 42 is formed and the boron ions are implanted. Namely, the ions are implanted into the region previously covered with the mask 42, in the preceding process step. Here, the dose is about $5 \times 10^{16}$ cm$^{-2}$ and the implantation energy is 50 KeV.

Thereafter, a laser irradiates the polycrystalline semiconductor layer, acting as a high energy beam. Here, the substrate is previously heated up to 500° C. and the continuous wave (CW) AR laser is used. Moreover, the laser irradiates the surface at a scan speed of about 10 cm/sec with a power of 10 W and spot size of 50 μm.

Thereby, the poly-Si layer 43 and substrate are partly melted, resulting in the impurity diffusion. Since the impurity diffusion rate in molten silicon is very high compared with that in solid silicon, there is no appreciable diffusion in solid silicon. Thus the impurity diffusion process is completed. Resultantly, the shallow diffusion area having a uniform depth can be obtained without generating abnormal diffusion in the areas near the boundary of the insulating film.

Figure 3H:
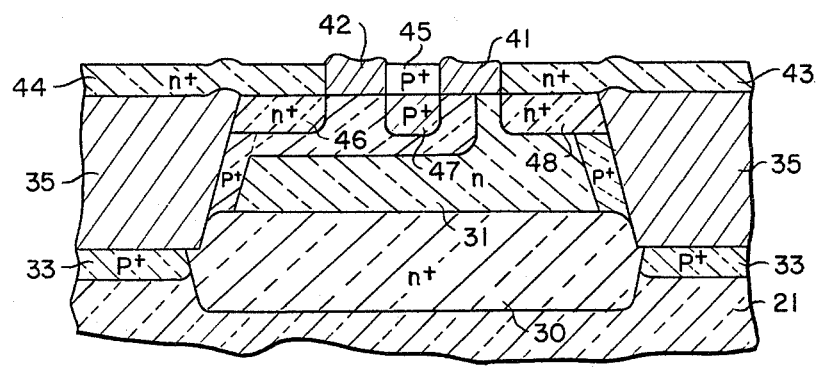

In FIG. 3H, reference numeral 43 and 44 comprise the single-crystallized n+ type polycrystalline semiconductor layer; reference numeral 45 is the recrystallized p+ polycrystalline semiconductor layer; reference numeral 46 is the n+ type emitter portion having a depth of about 0.2 $\mu$m; reference numeral 47 is the p+ type base contact portion having a depth of about 0.2 $\mu$m; reference numeral 48 is the n+ type collector contact portion having a depth of about 0.2 $\mu$m.

The poly-Si layer 36 is melted and recrystallized due to the irradiation of the laser beam, thus formed to be the recrystalline silicon layers 43, 44 and 45. The sheet resistance $\rho_s$ of the poly-Si layer is reduced from about 50 to 70 $\Omega$/square to 20 to 30 $\Omega$/square in the case of this single-crystallization.

Since the impurity diffused regions 46, 47 and 48, and the recrystallized semiconductor layers 44, 45 and 43 are melted due to the irradiation of the laser beam, an ohmic contact having a low resistance value is formed.

Figure 3I:
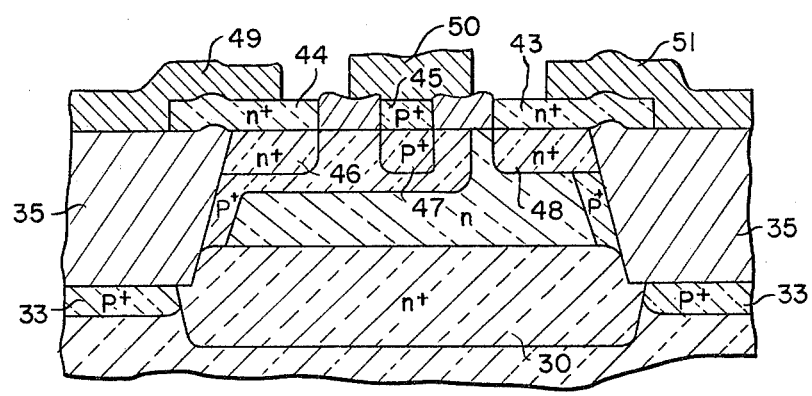

In FIG. 3I, reference numeral 49 is the emitter electrode comprising the Al layer; reference numeral 50 is the base electrode comprising the Al layer; 51 is the collector electrode consisting of Al, respectively.

Since the semiconductor layer connected to the impurity diffused region is recrystallized to single-crystalline structure, it can directly be used as the contact electrodes, after patterning without any problems. It can also be connected with the metal electrodes as required and as shown in FIG. 3I. Namely, since an ohmic contact having low resistance is obtained between the semiconductor layers and the impurity diffused region, all that is required for the metal electrodes such as aluminum is the connection with these semiconductor layers. Thus, the shallow pn junction is not destroyed by the alloying of the silicon and aluminum electrode, and also the electrodes can be formed by a simple processes, because the electrodes are not directly connected to the impurity diffused region.

FIGS. 4A through 4G show the embodiment of the present invention during the manufacturing of the silicon gate type MOS transistor.

Figure 4A:
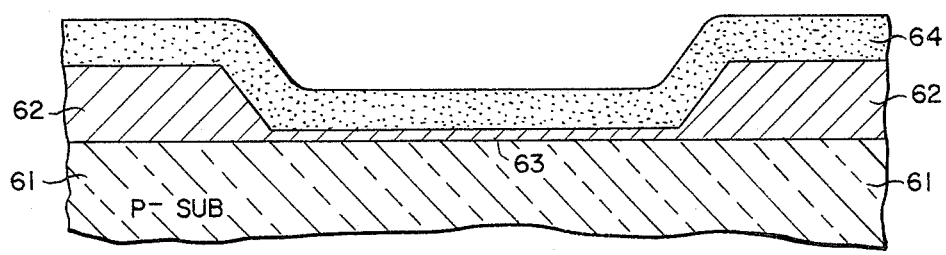

In FIG. 4A, reference numeral 61 is the p type silicon substrate having a specific resistance of 10 to 20 $\Omega$·cm; reference numeral 62 is the thick silicon dioxide (SiO$_2$) for element isolation; reference numeral 63 is the gate oxide film as thin as 500 Å in the element forming area; reference numeral 64 is the poly-Si layer housing a thickness of about 4000 Å. Phosphorus ions are implanted into the surface with a dose of $4\times10^{16}$ cm$^{-2}$ and energy of 50 KeV. Next, the annealing is carried out for about 20 min at a temperature of about 1050° C. in a N$_2$ atmosphere in order to activate the implanted ion. Thereafter, the phosphorus doped poly-Si layer 64 and the thin SiO$_2$ film 63 are etched by the ordinary photo-etching method.

Figure 4B:
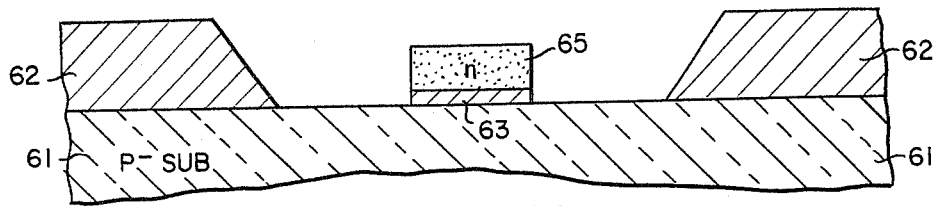
Figure 4C:
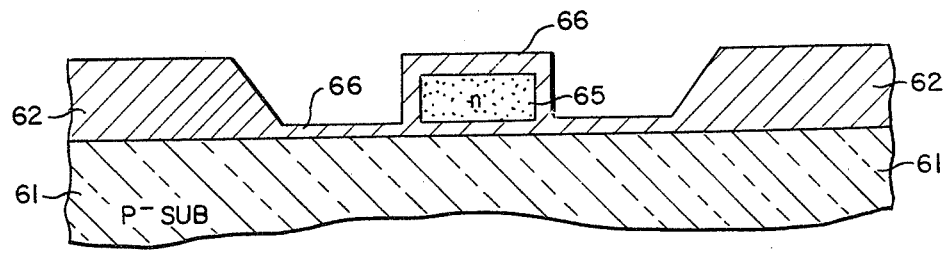

In FIG. 4B, reference numeral 65 is the gate electrode comprising the remaining poly-Si layer; reference numeral 63 is the gate oxide film remaining under the gate electrode. It is conventionally known that a poly-Si layer containing an impurity has higher oxidation rate than that of the single-crystalline semiconductor layer. Therefore, while the surface of silicon substrate 61 is oxidized to a thickness of about 500 Å, the surface of gate electrode comprising the phosphorus doped poly-Si layer 65 is oxidized to a thickness of about 4000 Å. In FIG. 4C, reference numeral 66 is the SiO$_2$ layer formed by this oxidation process. Such oxidation process is executed under a temperature of about 850° C. in a wet O$_2$ atmosphere.

Figure 4D:
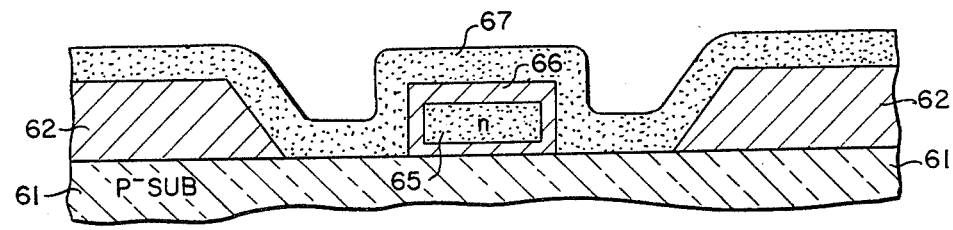

Next, the thin oxide film 66 formed on the substrate surface is removed by reactive ion etching using carbon tetrafluoride (CF$_4$) as the reaction gas. After the substrate surface is exposed by this reactive ion etching process, a silicon oxide film thicker than 3000 Å remains on the gate electrode. Next, a poly-Si layer is formed to a thickness of about 4000 Å on the entire surface by the ordinary CVD method. In FIG. 4D, reference numeral 66 is the silicon oxide layer remaining on the gate electrode, while reference numeral 67 is the poly-Si layer.

Then, phosphorus (P) ions or arsenic (As) ions are implanted into the surface with a dose of $4\times10^{-16}$ cm$^{-2}$ and energy of about 50 KeV, followed by the process that the implanted ions are activated, as in the previous annealing step, in a N$_2$ atmosphere.

Figure 4E:
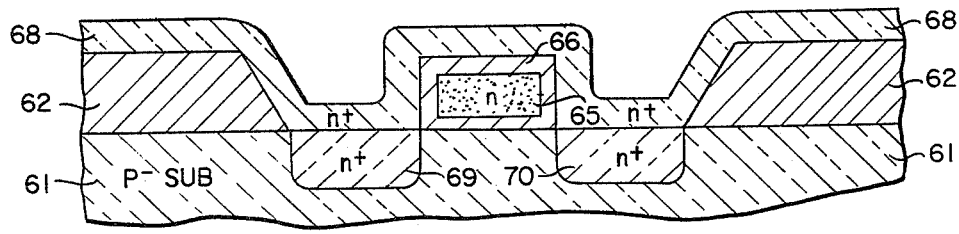

Thereafter, the impurities are diffused by irradiating a high energy laser beam onto the poly-Si layer 67. Here, the substrate is previously heated up to a temperature of about 500° C., and a CW Ar laser is used as the high energy beam. Thus, the laser beam irradiates the poly-Si layer with a power of 10 W, spot size of about 50 $\mu$m and a scan speed of about 10 cm/sec. Thereby, the poly-Si, containing the impurity and a part of the semiconductor substrate are melted, and the impurity diffusion and recrystallization of the poly-Si layer are carried out simultaneously. In FIG. 4E, reference numeral 68 is the recrystallized n+ type semiconductor layer; reference numeral 69 and 70 are the source, drain impurity diffusion regions having a depth of about 0.2 $\mu$m.

Figure 4F:
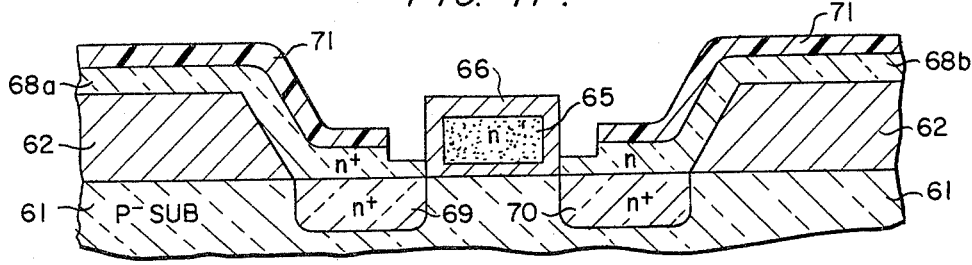

Next, after selectively forming a resist film on the surface of the device except for the area near the gate electrode, etching is carried out until at least the silicon oxide film 66 covering the gate electrode is exposed, by using the etching solution of the HF, HNO$_3$ and a buffer. In FIG. 4F, reference numeral 71 is a mask comprising a resist; reference numeral 66 is the oxide film on the exposed gate electrode; reference numeral 68a is the source electrode; reference numeral 69 is the drain electrode. After removing the resist 71, a protection film is formed on the entire surface or an oxide film is formed on the entire surface, thus completing formation of an element of a semiconductor circuit device.

As is explained in the embodiment of a bipolar transistor, the low resistance connection electrode is connected with the impurity diffused region, and such contact electrode itself has a low specific resistance such as 20 to 30 $\Omega$/square, compared with the conventional electrode.

Figure 4G:
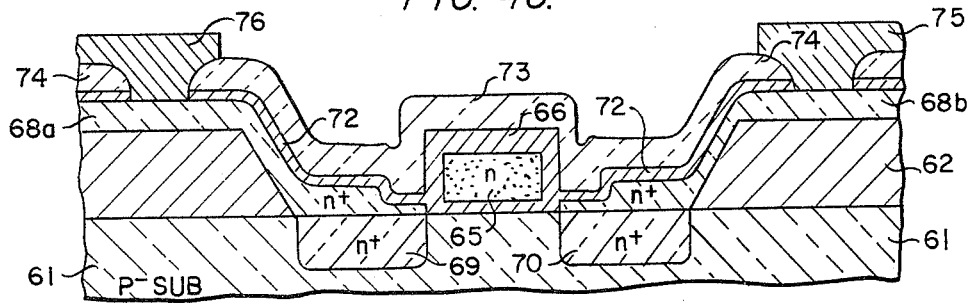

As shown in FIG. 4G, it is effective to combine the present invention with Al wiring.

In FIG. 4G, reference numeral 72 is the silicon dioxide layer obtained by oxidizing the surface of single-crystallized semiconductor layer 68; reference numeral 73 is the PSG film; reference numeral 74 is the window of PSG film melted to prevent breaks in the Al wiring; reference numeral 75 is the drain electrode comprising Al; reference numeral 76 is the source electrode comprising Al.

As shown in FIG. 4G, the present invention allows connection to electrode on the thick oxide film used for interelement isolation. This makes it possible to easily connect to the source and drain regions which must have been done conventionally in a comparatively narrow area, and is also effective for improving the yield of products.

As explained previously, the present invention diffuses an impurity from a semiconductor layer containing an impurity to a uniform depth in a semiconductor substrate, and also improves element characteristics. In addition, according to the present invention, the contact electrode can be extended with a low resistance from the impurity diffused region formed inside the semiconductor substrate. Moreover, the resistance value of the contact electrode itself can be reduced and element characteristic can be improved by recrystallizing said contact electrode.

The embodiment explained above is adapted to a semiconductor layer comprising a polycrystalline semiconductor layer, but it can also be adapted to an amorphous semiconductor layer.

The present invention can also be realized by using an Ar laser, a ruby laser, and also an ion beam, photon beam and electron beam, etc. as the high energy beam.

What is claimed is:

1. A method of manufacturing a semiconductor device having a semiconductor substrate, comprising the steps of:
   (a) forming an insulating layer having a window on the semiconductor substrate, the window extending through the insulating layer to the semiconductor substrate;
   (b) forming a semiconductor layer containing an impurity on the insulating layer and in the window;
   (c) melting the semiconductor layer underlying the window and the semiconductor substrate adjacent to the semiconductor layer underlying the window by irradiating the semiconductor layer with a high energy beam such that said impurity is diffused into a portion of the semiconductor substrate; and
   (d) selectively etching the semiconductor layer to form a contact electrode contacting the portion of the substrate diffused with said impurity.

2. A method of manufacturing a semiconductor device having a semiconductor substrate, comprising the steps of:
   (a) forming a semiconductor layer including an impurity, on the semiconductor substrate;
   (b) selectively oxidizing the semiconductor layer to form a window on the unoxidized portions of the semiconductor layer;
   (c) irradiating the semiconductor layer with a high energy beam to diffuse the impurity into a portion of the substrate underlying the window and to simultaneously melt the semiconductor layer; and
   (d) selectively etching the semiconductor layer to form a contact electrode contacting the portion of the substrate diffused with the impurity.

3. A method of manufacturing a semiconductor device having a semiconductor substrate, comprising the steps of:
   (a) forming an insulating layer having a window on the semiconductor substrate, said window extending through the insulating layer to the semiconductor substrate;
   (b) forming a semiconductor layer on the insulating layer and in the window;
   (c) diffusing an impurity into the semiconductor layer;
   (d) irradiating the semiconductor layer with a high energy beam to diffuse the impurity into a portion of the substrate underlying the window and simultaneously to melt the semiconductor layer; and
   (e) selectively etching the semiconductor layer to form a contact electrode contacting the portion of the substrate diffused with the impurity.

4. A method of manufacturing a semiconductor device according to claim 1, 2 or 3, wherein the semiconductor layer comprises a polycrystalline layer.

5. A method of manufacturing a semiconductor device according to claim 1, 2 or 3, wherein the high energy beam is a laser beam.

6. A method of manufacturing a semiconductor device according to claim 1, 2 or 3, wherein the semiconductor layer and the semiconductor substrate each comprise silicon.

7. A method of manufacturing a semiconductor device having electrodes, a semiconductor substrate having a first conductivity type and a surface, comprising the steps of:
   (a) forming a diffusion region having a second conductivity type opposite the first conductivity type, in a first portion of the surface of the semiconductor substrate;
   (b) forming a first semiconductor layer having the second conductivity type, on the surface of the semiconductor substrate;
   (c) thermally oxidizing the first semiconductor layer;
   (d) forming a mesa of the first semiconductor layer, having sides and a specified height and positioned over the first portion of the semiconductor substrate, by selectively etching the first semiconductor layer;
   (e) implanting first ions, having the first conductivity type, into the first semiconductor layer and the sides of the mesa;
   (f) forming an oxide layer having a height equal to the specified height of the mesa on the etched portions of the first semiconductor layer, and simultaneously diffusing the first ions;
   (g) selectively implanting second ions, having the first conductivity type, into the top of the mesa;
   (h) forming a second semiconductor layer on the top of the mesa and on the oxide layer;
   (i) selectively oxidizing first and second portions of the second semiconductor layer;
   (j) selectively implanting third ions, having the second conductivity type, into third and fourth portions, adjacent to the first and second portions, of the second semiconductor layer;
   (k) selectively implanting fourth ions, having the first conductivity type, into a fifth portion of the second semiconductor layer; and
   (l) irradiating the second semiconductor layer with a laser to diffuse the third and fourth ions and to simultaneously melt the second semiconductor layer, the third, fourth and fifth portions of the second semiconductor layer corresponding to the electrodes of the semiconductor device.

8. A method of manufacturing a semiconductor device according to claim 7, wherein the second semiconductor layer comprises polysilicon.

* * * * *

UNITED STATES PATENT AND TRADEMARK OFFICE
CERTIFICATE OF CORRECTION

PATENT NO. : 4,407,060
DATED : October 4, 1983
INVENTOR(S) : Junji Sakurai

It is certified that error appears in the above-identified patent and that said Letters Patent is hereby corrected as shown below:

```
Column 1, line 9, "device" should be --device,--;
Column 2, line 45, "impurity" should be --impurities--;
"containing impuri" should be --containing an impurity,--;
          line 46, delete "ties".
Column 3, line 18, "ates to the" should be --ates the--;
          line 24, "region having" should be --region, having--;
          line 29, "structure and" should be --structure, and--;
Column 4, line 22, "to such a" should be --to a--;
          line 24, "numeral" should be --numerals--;
          line 42, "36" should be --52--.
Column 5, line 31, "; 51" should be --; reference numeral 51--;
          line 32, "consisting of" should be --comprising--;
          line 56, "housing" should be --having--;
          line 62, "ion" should be --ions--.
```

UNITED STATES PATENT AND TRADEMARK OFFICE
CERTIFICATE OF CORRECTION

PATENT NO. : 4,407,060
DATED : October 4, 1983
INVENTOR(S) : Junji Sakurai

Page 2 of 2

It is certified that error appears in the above-identified patent and that said Letters Patent is hereby corrected as shown below:

Column 6, line 41, "device" should be --device,--.

Signed and Sealed this

Second Day of July 1985

[SEAL]

Attest:

DONALD J. QUIGG

*Attesting Officer*  *Acting Commissioner of Patents and Trademarks*